United States Patent Office 3,399,994

Patented Sept. 3, 1968

3,399,994

PROCESSING OF PRESENSITIZED PHOTO-LITHOGRAPHIC PRINTING PLATES

Leonard James Watkinson, Leeds, England, assignor to W. H. Howson Limited, Leeds, Yorkshire, England, a British company No Drawing. Filed July 26, 1965, Ser. No. 474,936
Claims priority, application Great Britain, July 29, 1964, 30,056/64
10 Claims. (Cl. 96—48)

ABSTRACT OF THE DISCLOSURE

A homogeneous developing solution for an exposed presensitized photolithographic printing plate comprising a desensitizing organic colloid dissolved in an organic solvent medium, said solvent medium being capable of removing the unexposed portions of said coating, such that the area of the plate thereby exposed would be hydrophilic.

This invention relates to the processing of presensitized photolithographic printing plates.

Photolithographic printing plates of the type commonly known as "presensitized" consist of a suitable base material provided with a coating of a light sensitive substance. The essential property of the base material is that it shall have a hydrophilic surface or one which can readily be rendered hydrophilic, thus enabling it to function as the non-image area of the final exposed and developed plate. The material forming the light sensitive coating must fulfill three requirements. First, exposure of portions of the coating to light must render exposed and unexposed portions differentially soluble in a suitably chosen solvent. Secondly, the portions of the coating remaining after soluble portions of the coating have been removed by the selected solvent must be either lipophilic or readily converted to this condition so that they will accept ink in use. Thirdly, the material forming the light sensitive coating must be sufficiently stable to enable the coated plates to be stored under normal conditions for protracted periods before exposure to light. This latter requirement is in contradistinction to those lithographic plates which are rendered light sensitive by the use of dichromated colloids which are not stable for more than a few hours or days.

A wide range of materials may be used for the base, paper having a suitable surface and aluminium sheet being the most commonly used materials. The light sensitive substance used may also be selected from a wide range of suitable materials. These materials fall mainly into two groups. First, those characterised by possession of the diazo group $=N_2$ which are close relatives of organic dyestuffs; and secondly, resin esters of certain unsaturated acids, for example, cinnamic and furylacrylic acids. Depending on the light sensitive material selected, the exposed and unexposed material may have a differential solubility in either water or an aqueous solution, or in an organic solvent which may or may not be soluble in water.

In the production of a printing plate from such presensitized plates, the plate, after exposure to light to produce the appropriate image and non-image portions, will normally require several processing steps in order to produce the final printing plate. These steps are as follows:

(1) Selective solvent removal of unrequired portions of the coating. This step is essential and constitutes the true development process.

(2) Rendering of the non-image area hydrophilic, a process known in the lithographic art as "desensitizing" or "etching," and which will hereinafter be referred to as "desensitizing." This step may not be necessary if such areas are naturally sufficiently hydrophilic.

(3) Rendering of the image areas lipophilic. This step also may not be necessary if such areas are naturally sufficiently lipophilic.

(4) Colouring of the image areas to make them visible for inspection, retouching and the like. This step may not be required if the light sensitive coating is itself coloured or becomes coloured on exposure to light.

It will be seen that the only step which is essential in all cases is step 1, the actual development process. Steps 2, 3 and 4 may or may not be necessary depending on the properties of the base material and light sensitive coating used, but in the vast majority of cases one or more of these steps will also be necessary.

It would be of obvious advantage if step 1 and such of steps 2, 3 and 4 as may be necessary for any given combination of base and light sensitive material could be carried out together, so that only a single operation would be necessary to render the plate ready for printing. Such a procedure is, however, difficult since the conditions for the various steps tend to be mutually exclusive. Steps 3 and 4 and sometimes also step 1 are best carried out using non-aqueous solution. Step 2, however, is usually best carried out using certain organic colloidal materials, such as gum arabic, cellulose ethers, alginates, dextrins and the like, in aqueous solution. Aqueous solutions of such colloidal material are intolerant of the presence of large proportions of water-soluble organic solvents of the types normally needed for the other steps, the colloidal material being precipitated.

It has previously been proposed to avoid this difficulty by employing water-insoluble organic solvents in the form of an emulsion with water or an aqueous solution. The phases of the emulsion perform separate and diverse tasks, but these are carried out simultaneously on the plate. Such emulsions introduce, however, their own problems. It is almost inherent in the nature of such emulsions that they will be unstable. This leads to poor keeping qualities, and it has in fact, been proposed to supply the two phases separately, to be combined by the operator before use. When the emulsion is stored as such, erratic action in the processing of the printing plates may be encountered owing to the operator forgetting to shake the bottle before use.

It is an object of the present invention to avoid such difficulties by the provision of a homogeneous developing solution having no tendency to separate out yet at the same time capable of carrying out all the functions required of it.

According to one aspect of the present invention, a developing solution for a presensitized photolithographic printing plate comprises a desensitizing organic colloid dissolved in an organic solvent or a mixture of solvents is effective to remove unrequired portions of the sensitised coating of the plate after exposure.

According to another aspect of the invention, a process for developing an exposed presensitized photolithographic printing plate comprises treating the exposed plate with a developing solution according to the previous paragraph.

The present invention is based on the discovery that certain colloids of the general types known to possess desensitizing powers are soluble in organic solvents alone and that in such solutions they still exhibit useful desensitizing properties. Examples of such colloids are cellulose derivatives, such as methyl cellulose. Certain substances of known desensitizing action and of low molecular weight, such as, for example, phosphoric and citric acids, are soluble in some organic solvents and may be used to enhance the desensitizing action of the colloids.

The selection of a particular organic solvent will be determined by the solubility of the particular colloid used therein. Preferably, a colloid will be used which is soluble in an organic solvent such solvent being also capable of dissolving unwanted portions of the sensitized coating. If, however, the sensitized coating is not soluble in any solvent capable of dissolving the colloid, another organic solvent which is capable of dissolving the sensitized coating and which is miscible with the colloid solution may be added to produce a suitable developer solution.

If desired, an agent capable of rendering the image areas of the developed plate lipophilic and soluble in the organic solvent or solvent mixture may be present in the developer solution. Similarly, the developer solution may contain an organic solvent-soluble dyestuff to render the image areas visible.

The present invention thus provides a developer solution which is in the form of a homogeneous solution capable in a single operation of carrying out steps 1 and 2 of the development process outlined above, and if necessary, steps 3 and/or 4 also.

The invention is illustrated by the following examples:

Example 1

The following developing solution has been found to be satisfactory in processing plates sensitized with polyvinyl cinnamate:

| | | |
|---|---|---|
| Dimethylformamide | ml | 79 |
| 3-methoxybutyl acetate | ml | 21 |
| Methyl cellulose | g | 4.0 |
| Oracet Blue B | g | 0.4 |
| Phosphoric acid | g | 0.1 |
| Tween 20 | g | 0.5 |

In this case, the light sensitive coating is dissolved by the mixture of 3-methoxylbutyl acetate and dimethylformamide, thus carrying out step 1. This mixture is also a solvent for the methyl cellulose and phosphoric acid which together carry out step 2, i.e. render non-image areas of the plate hydrophilic.

Step 3 is not strictly necessary with this type of light sensitive material, but the proprietary surface active agent Tween 20, which is soluble in the solvent mixture, has been found to have the effect of enhancing the natural lipophilic properties of the light sensitive coating. Step 4 is performed by the Oracet Blue B which is an oil soluble dyestuff and is soluble in the solvent mixture. A further use of surface active agents when employed in massive quantities is to facilitate the removal of the developer by washing with water at the end of the developing stage. This is illustrated in Example 5 below.

Example 2

The following developer solution has also been found to be satisfactory in processing plates sensitised with polyvinyl cinnamate:

| | | |
|---|---|---|
| Hydroxypropylmethylcellulose in dimethylformamide (10% solution (w./v.)) | ml | 20 |
| Tetrahydrofurfuryl alcohol | ml | 20 |
| Dimethylformamide | ml | 10 |
| Phosphoric acid (s.g. 1.75) | ml | 0.07 |
| Waxoline Red OS | g | 0.2 |
| Nansa YS 94 (a dispersing agent) | g | 0.3 |

Example 3

The following developer solution has also been found to be satisfactory in processing plates sensitised with polyvinyl cinnamate:

| | | |
|---|---|---|
| Ethylhydroxyethylcellulose in tetrahydrofurfuryl alcohol (10% solution (w./v.)) | ml | 10 |
| Tetrahydrofurfuryl alcohol | ml | 40 |
| Ethylglycol acetate | ml | 5 |
| Phosphoric acid (s.g. 1.75) | ml | 0.1 |
| Waxoline Red OS | g | 0.2 |

Example 4

The following developer solution has also been found to be satisfactory in processing plates sensitised with polyvinyl cinnamate:

| | | |
|---|---|---|
| Ethylhydroxyethylcellulose in dimethylformamide (10% solution (w./v.)) | ml | 10 |
| Tetrahydrofurfuryl alcohol | ml | 10 |
| Isophorone | ml | 5 |
| Phosphoric acid (s.g. 1.75) | ml | 0.3 |
| Oracet Blue B | ml | 0.15 |

Example 5

The following developer solution has also been found to be satisfactory in processing plates sensitised with polyvinyl cinnamate:

| | | |
|---|---|---|
| Ethylhydroxyethylcellulose in dimethylformamide (10% solution (w./v.)) | ml | 20 |
| Dimethylformamide | ml | 20 |
| Citric acid | g | 0.1 |
| Tween 20 | g | 10 |
| Waxoline Blue AS | g | 0.2 |

What I claim as my invention and desire to secure by Letters Patent of the United States is:

1. A homogeneous developing solution suitable for developing a presensitized photolithographic printing plate comprising a coating of an organic solvent soluble photopolymerisable resin ester of an unsaturated acid, after exposure thereof, which solution comprises a desensitizing organic colloid dissolved in an organic solvent medium, said solvent medium being capable of removing the unexposed portions of said coating, such that the area of the plate thereby exposed would be hydrophilic.

2. A developing solution according to claim 1 wherein said solution also contains a non-colloidal desensitizing agent which is soluble in said solvent medium.

3. A developing solution according to claim 1 wherein said solution also contains a surface active agent capable of rendering lipophilic the image areas of the developed plate and which is soluble in said solvent medium.

4. A developing solution according to claim 1 wherein said solution also contains a colorant capable of rendering visible the image areas of the developed plate and which is soluble in said solvent medium.

5. A developing solution according to claim 1 wherein said desensitizing organic colloid is a cellulose derivative.

6. A developing solution according to claim 1 wherein said solvent medium contains at least one compound selected from the group consisting of dimethylformamide, 3-methoxybutyl acetate, tetrahydrofurfuryl alcohol and ethylglycol acetate.

7. A developing solution according to claim 2 wherein the desensitizing agent is selected from the group consisting of phosphoric acid and citric acid.

8. A developing solution according to claim 5 wherein sail cellulose derivative is selected from the group consisting of hydroxypropylmethyl cellulose and ethylhydroxyethyl cellulose.

9. In a process for developing a presensitized photolithographic printing plate comprising a coating of an organic solvent soluble photopolymerisable resin ester of an unsaturated acid, after exposure thereof, the improvement which comprises treating the exposed plate with a developing solution comprising a homogeneous solution of a desensitizing organic colloid dissolved in an organic solvent medium.

10. In a process for developing a presensitized photolithographic printing plate comprising a coating of an organic solvent soluble photopolymerisable resin ester of an unsaturated acid, after exposure thereof, the improvement which comprises treating the exposed plate with a homogeneous developing solution containing a colloid cellulose derivative in an organic solvent medium, a desensitizing agent selected from the group consisting of phosphoric acid and citric acid, and a surface active agent.

References Cited

UNITED STATES PATENTS 2,865,873 12/1958 Hodgins et al. ------- 96—49 X
3,019,106 1/1962 Adams --------------- 96—49

NORMAN G. TORCHIN, *Primary Examiner.*

R. E. MARTIN, *Assistant Examiner.*